(12) United States Patent
Jauhiainen et al.

(10) Patent No.: US 8,496,753 B2
(45) Date of Patent: Jul. 30, 2013

(54) ARRANGEMENT IN CONNECTION WITH ALD REACTOR

(75) Inventors: Mika Jauhiainen, Jyvaskyla (FI); Pekka Soininen, Helsinki (FI)

(73) Assignee: Beneq Oy, Vantaa (FI)

(*) Notice: Subject to any disclaimer, the term of this patent is extended or adjusted under 35 U.S.C. 154(b) by 495 days.

(21) Appl. No.: 12/937,782

(22) PCT Filed: Jun. 9, 2009

(86) PCT No.: PCT/FI2009/050487
§ 371 (c)(1),
(2), (4) Date: Oct. 14, 2010

(87) PCT Pub. No.: WO2009/150297
PCT Pub. Date: Dec. 17, 2009

(65) Prior Publication Data
US 2011/0036291 A1  Feb. 17, 2011

(30) Foreign Application Priority Data

Jun. 12, 2008 (FI) .................................. 20085580

(51) Int. Cl.
*C23C 16/00* (2006.01)
*C23C 16/455* (2006.01)

(52) U.S. Cl.
USPC ........................................................ 118/715

(58) Field of Classification Search
USPC ..................... 118/715; 156/345.33, 345.29
See application file for complete search history.

(56) References Cited

U.S. PATENT DOCUMENTS

| 4,389,973 | A | | 6/1983 | Suntola et al. | |
|---|---|---|---|---|---|
| 4,413,022 | A | | 11/1983 | Suntola et al. | |
| 5,224,513 | A | * | 7/1993 | Bertone | ........................ 137/597 |
| 5,657,786 | A | * | 8/1997 | DuRoss et al. | ............. 137/15.01 |
| 6,022,414 | A | * | 2/2000 | Miller et al. | ................... 118/718 |
| 6,068,703 | A | * | 5/2000 | Chen et al. | ..................... 118/715 |
| 2002/0041931 | A1 | | 4/2002 | Suntola et al. | |
| 2004/0079286 | A1 | | 4/2004 | Lindfors | |
| 2004/0261706 | A1 | | 12/2004 | Lindfors et al. | |
| 2006/0266289 | A1 | | 11/2006 | Verghese et al. | |

(Continued)

FOREIGN PATENT DOCUMENTS

| WO | WO 2006/000643 A1 | 1/2006 |
|---|---|---|
| WO | WO 2007/084493 A2 | 7/2007 |

OTHER PUBLICATIONS

Finnish Patent Application No. 20055612 filed on Nov. 17, 2005 in the name of Soininen et al.

(Continued)

*Primary Examiner* — Jeffrie R Lund
*Assistant Examiner* — Yuechuan Yu
(74) *Attorney, Agent, or Firm* — Oliff & Berridge, PLC

(57) ABSTRACT

The invention relates to an arrangement in connection with an ALD reactor comprising a reaction chamber, the arrangement comprising fittings for feeding a reaction gas to the reaction chamber and for suctioning the reaction gas back, and fittings for feeding a barrier gas. The fittings for feeding and suctioning back the reaction gas and for feeding the barrier gas comprise a middle element having multiple parallel channels which extend through the element, and a first and a second flow-reversing element arranged at ends of the middle element into which the channels open, the flow-reversing elements being arranged to combine the channels in the middle element so as to provide an interchannel flow.

15 Claims, 3 Drawing Sheets

U.S. PATENT DOCUMENTS

Figure 1:
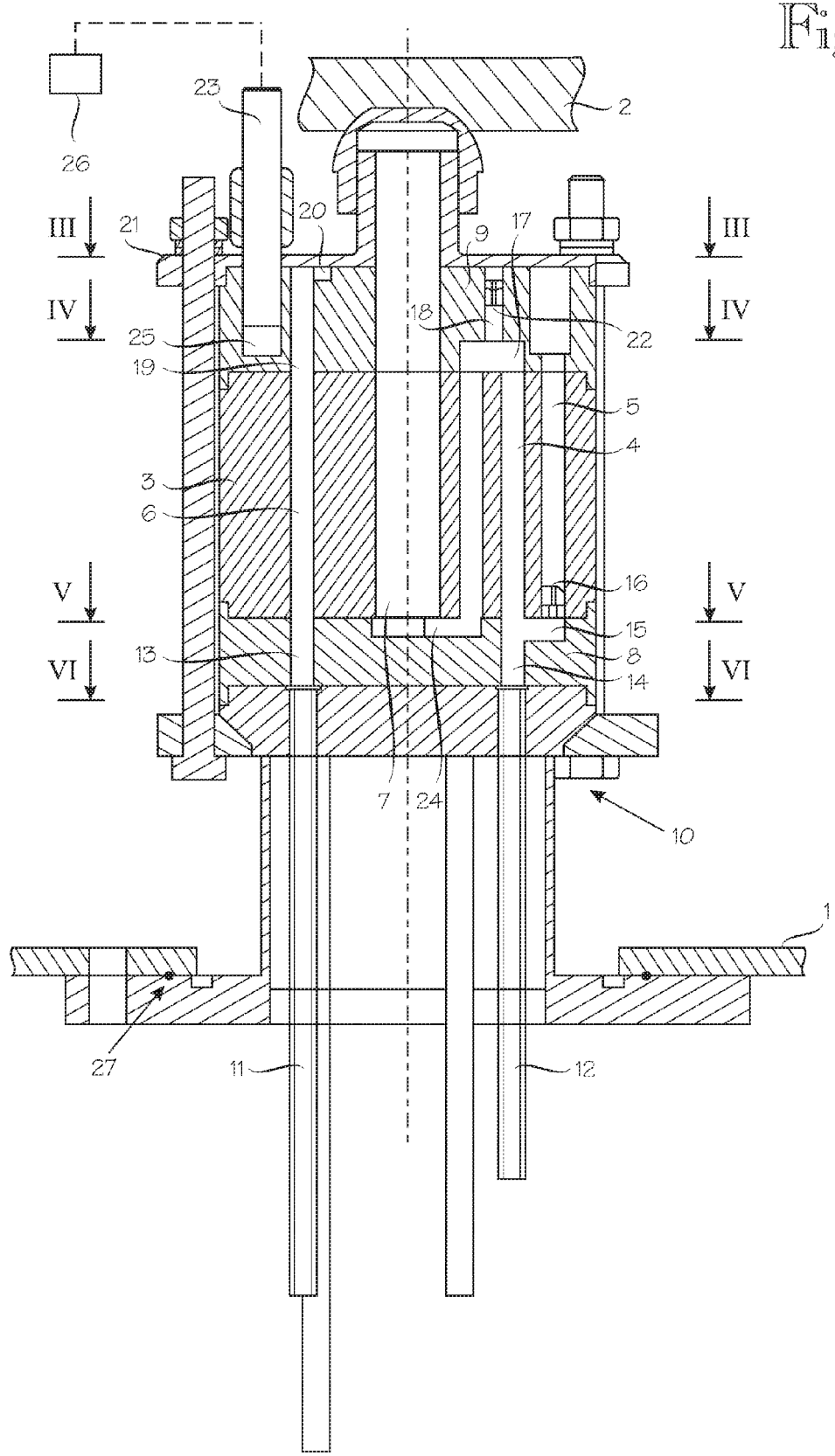

2007/0089674 A1  4/2007  Aitchison et al.
2008/0110399 A1  5/2008  Park et al.
2009/0169743 A1  7/2009  Soininen et al.
2009/0255470 A1  10/2009 Soininen et al.

OTHER PUBLICATIONS

Finnish Patent Application No. 20055613 filed on Nov. 17, 2005 in the name of Soininen et al.

International Search Report issued in Application No. PCT/FI2009/050487; Dated Nov. 17, 2009.

Written Opinion of the International Searching Authority issued in Application No. PCT/fi2009/050487; Dated Nov. 17, 2009.

Finnish Search Report issued in Application No, 20085580; Dated Apr. 28, 2009 (With Translation).

* cited by examiner

ARRANGEMENT IN CONNECTION WITH ALD REACTOR

The invention relates to an arrangement in connection with an ALD reactor comprising a reaction chamber, the arrangement comprising fittings for feeding a reaction gas to the reaction chamber and for suctioning the reaction gas back, and fittings for feeding a barrier gas.

A reaction chamber is a main component of an ALD (Atomic Layer Deposition) reactor, wherein substrates to be handled are placed. An ALD process is based on intermittent, saturated surface reactions wherein the surface controls the growth of a film. Therein, each reaction component is separately brought into contact with the surface. In the reaction chamber, reaction gases and flushing gas pulses therebetween are thus sequentially led over the substrates.

In the design of ALD reactors, it is important to achieve good flow dynamics and sharp pulses. In order to sharpen the pulses and sometimes also as the only barrier, a principle called inert gas valving is used wherein by an appropriate feed and flow of inert gas the flow of reaction gas to a substrate in the reaction chamber is prevented.

The aforementioned function is to be carried out as close to the reaction chamber as possible so as to prevent the post-barrier length of a feed pipe or feed channel from causing a tail to the reaction component pulse, i.e. molecules being released from surfaces which, when mixing with the next pulse, cause CVD (Chemical Vapour Deposition) growth. This CVD growth owing to the tail is absolutely not to be allowed on the substrate since then the deposition no longer takes place according to ALD, controlled by the surface, in which case the properties of the deposited thin film change.

The earliest barrier pipes were made from glass by means of so-called lip pipes, whereby barrier flows were brought by coaxial pipe fittings to a desired place. These solutions are large, expensive and fragile. A later solution was to use grooves provided in plates that provided 3D pipe systems by stacking such groove plates on top of one another. It is preferable to make such grooves directly into the walls of the reactor chamber; this is the most common embodiment of the prior art. A problem is to provide the multiple barrier grooves and the barrier feeds received therein as well as suctions symmetrically and as identical for several starting materials. The number and/or size of the plates increases as a result of such packaging. When it is desired to pack a reaction chamber with its barriers in a small or flat space, the plate solution easily becomes difficult to implement. In addition, in the case of several sources, the number of gas fittings to be coupled is large and their coupling over a large area is difficult. The length of contaminating gas grooves also easily tends to increase. An attempt to solve this, again, is provided in the prior art by reserving space e.g. under the apparatus wherein the necessary flow paths are formed by folding a length of ordinary pipe so as to achieve a desired solution. This is a functioning solution but it requires space and there is no way to see inside the folded pipes and thus assess the need for cleaning.

The ALD process in general and the aforementioned inert gas valving principle and ALD reactors are described in PCT publication WO 2006/000643, U.S. Pat. No. 4,413,022, and FI patent applications 20055612. and 20055613, to which reference is herein made as examples of the prior art.

An object of the invention is to provide an arrangement which enables the disadvantages of the previously known prior art to be eliminated. This is achieved by the arrangement according to the invention. The arrangement according to the invention is characterized in that the fittings for feeding and suctioning back the reaction gas and for feeding the barrier gas comprise a middle element having multiple parallel channels which extend through the element, and a first and a second flow-reversing element arranged at ends of the middle element into which the channels open, the flow-reversing elements being arranged to combine the channels in the middle element so as to provide an interchannel flow.

An advantage of the invention is mainly that the invention enables good flow dynamics and sharp pulses to be provided. This enables elimination of the aforementioned disadvantageous pulse tails which, when being mixed with the next pulse, would cause CVD growth. The invention also enables the gas channels to be combined in an advantageous manner before being led to the reaction chamber, whereby possible CVD growth is formed in the feed channel and not on the surface of the substrate. In the solution according to the invention, gases coming from different sources may also be mixed in an advantageous manner into as homogeneous a flow as possible. Non-homogeneity results in the substrate being provided with a non-uniform dosage, which, in turn, leads to slowness, poor material efficiency and a non-uniform film. A further advantage of the invention is that the shaping and arrangement of the barrier channels may be made as identical for all starting gases as possible, whereby their behaviour can be standardized. The structure may also be made in an advantageous manner such that the cleaning of the channels and the checking of the cleanness thereof becomes very easy. The number of corners and inner surfaces may also be minimized in the invention and the feed and back suction of the inert barrier gas can be made adjustable in an advantageous manner.

Figure 2:
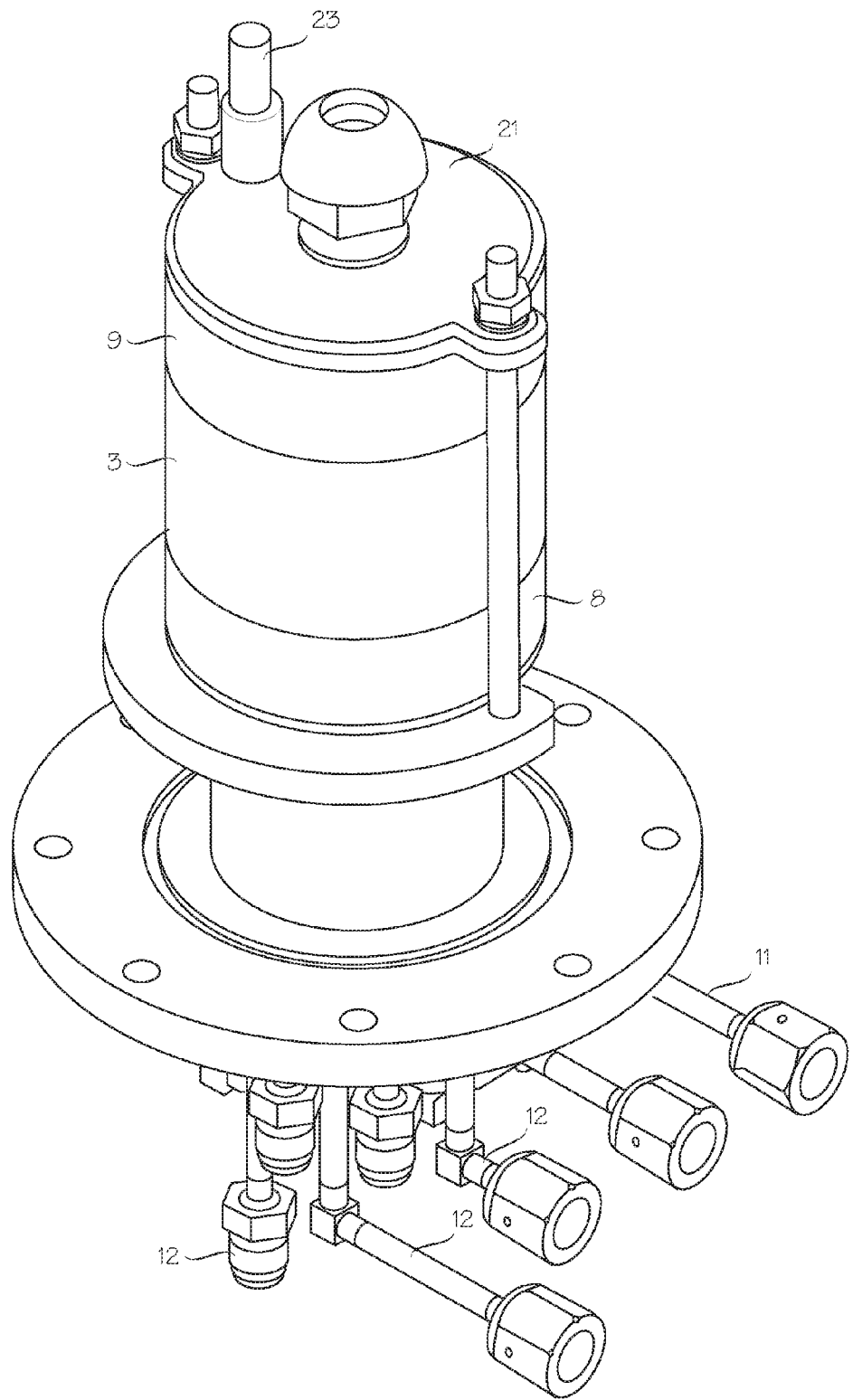
Figure 3:
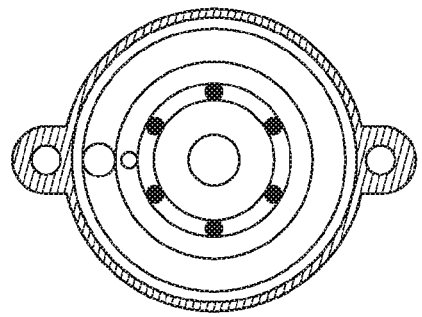
Figure 4:
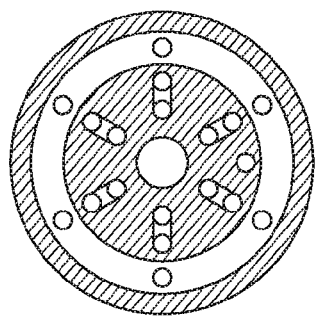
Figure 5:
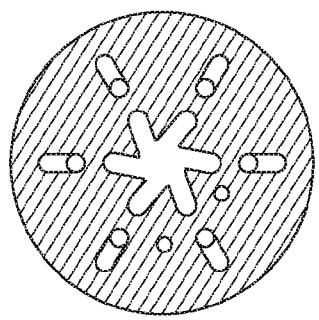
Figure 6:
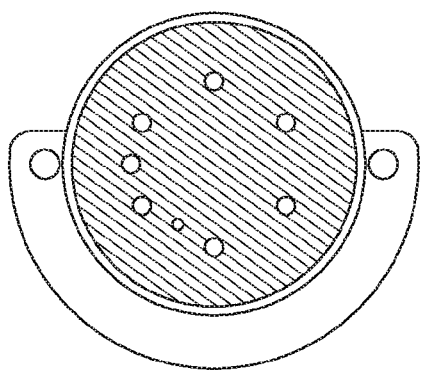

In the following, the invention will be described in closer detail by means of an exemplary embodiment set forth in the accompanying drawing, in which FIG. 1 shows an arrangement according to the invention as a schematic sectional view, FIG. 2 shows a perspective view of the arrangement according to FIG. 1, FIG. 3 is a sectional view according to arrows III-III in FIG. 1, FIG. 4 is a sectional view according to arrows IV-IV in FIG. 1, FIG. 5 is a sectional view according to arrows V-V in FIG. 1, and FIG. 6 is a sectional view according to arrows VI-VI in FIG. 1.

FIGS. 1 to 6 schematically show an arrangement according to the invention. FIG. 1 schematically shows an embodiment where an ALD reactor comprises an underpressure chamber 1 and an underpressurized reaction chamber 2 arranged inside the underpressure chamber. In an ALD process, substrates to be handled are placed in the reaction chamber 2 and in the process, reaction gases and inert gas therebetween are lead intermittently sequentially to a surface of the substrate to be handled, as set forth above. In the example of FIG. 1, the reaction chamber is inside the underpressure chamber, but it is possible that the underpressure chamber acts at the same time as a reaction chamber.

The structures and functions of the underpressure chamber 1 and the reaction chamber in connection with an ALD reactor as well as the feeding of the aforementioned gases are completely ordinary operation to the person skilled in the art, so this is not discussed in closer detail in this context. Herein, reference is made to the publications set forth above in connection with the description of the prior art.

The arrangement according to the invention thus comprises first means, e.g. fittings, which form flow paths for intermittently feeding at least one reaction gas to the reaction chamber 2 and for suctioning back the reaction gas, and second means, e.g. fittings, which form flow paths for feeding barrier gas pulses in between reaction gas feed cycles. It is essential in the invention that the aforementioned fittings comprise a middle element 3 having several parallel channels 4 to 7 which extend through the element, as well as a first and a second flow-reversing element 8, 9 which are arranged at ends of the middle element into which the channels 4 to 7 open, the flow-reversing elements being arranged to combine the channels 4 to 7 in the element so as to provide interchannel flow.

The middle element 3 is preferably formed from a massive piece into which the channels 4 to 7 are provided by drilling. The piece made of a massive material may preferably be a piece made of a bar-like material, whereby the middle element is substantially a cylindrical element in its shape.

The first and the second flow reversing elements may each be formed from substantially flange-like elements whose dimensions are compatible with those of the middle element, as shown in the figures.

In the solution according to the invention according to FIGS. 1 and 2, the gases, i.e. the reaction gases and the inert barrier gases, e.g. nitrogen, are brought via one flange structure 10 to the underpressure chamber 1 and further to the reaction chamber 2. The upper surface of the flange structure 10 is formed such that the lower surface of the first flow-reversing element 8 sits tightly therein with the surfaces facing one another. Gas fittings 11, 12 of the flange structure and the fittings of the first flow-reversing element 8, e.g. through drillings 13, 14, form uniform flow paths having, as their common extension, further the channels 4 to 7 provided in the middle element. When necessary, all connections between the channels, fittings and drillings and also between the flange structure 10 and the first flow-reversing means 8 may be sealed between the aforementioned parts.

As can be seen e.g. in FIG. 1 and as disclosed above, the middle element 3 is arranged on top of the first flow-reversing element 8. A surface facing an end of the middle element of the first flow-reversing element 8 is provided with first grooves 15 which together with the surface of the middle element 3 form flow paths between the through drillings 14 and the channels of the middle element. For example in FIG. 1 it can be seen that a groove 15 forms a flow connection between the through drilling 14 and a channel 5.

In the example of the figures, the channel 5 functions as a back-suction channel, in other words by means of the channel 15, a side fitting is formed for each reaction agent gas fitting for back suction. This back-suction fitting is connected slightly sideways from the reaction agent fitting by means of the aforementioned groove 15. The middle piece is provided with a particular channel both for feeding and suctioning back the reaction agent. Such an arrangement is provided for each reaction agent. In FIG. 1, the channel 4 is a feed channel for one reaction agent and the channel 5, respectively, is a back-suction channel. FIG. 2 shows the arrangement according to FIG. 1 as a perspective view showing that in this embodiment six gas fittings 12 are provided for reaction gases and one gas fitting 11 for a barrier gas. The numbers may naturally vary as necessary.

The magnitude of the back suction may preferably be adjusted by placing an adjustment element 16 or a reduction in the back suction channel 5 for providing flow adjustment. The adjustment element 16 may be formed e.g. from a choke screw, i.e. a screw member having a channel for producing a desired choking effect drilled therein. The reduction may be formed e.g. by narrowing the channel locally so that a desired choking effect is achieved. The barrier flow may be formed e.g. by means of nitrogen gas. The back suction is provided by means of a pump means which is connected to a discharge fitting 23.

On top of the middle element 3 a second flow-reversing element 9 is arranged such that second grooves 17 provided therein are used for reversing the gas flow back downwards. The second groove 17 is further provided with a second drilling 18 whose purpose is to convey the inert barrier gas to the channel system and thus periodically prevent the reaction gas from flowing to the reaction chamber.

The barrier gas is fed to the arrangement via the gas fitting 11 to the first through drilling 13 of the first flow-reversing element and therefrom further to the channel 6 of the middle element 3 and further, via a fitting 19, e.g. a drilling, of the second flow-reversing element to a groove 20 provided on a surface facing away from the middle element of the second flow-reversing element 9. On top of the second flow-reversing element 9, a cover element 21 is arranged whose lower surface together with the groove 20 form a flow path for the barrier gas. The flow path formed by the groove 20 and the cover element 21 leads the barrier gas to the second drilling 18 which leads the barrier gas to the second groove 17 as described above. The drilling 18 may be provided with an adjustment element 22 or a reduction so as to achieve flow choking. The adjustment element 22 may be e.g. a choke screw, i.e. a screw member having a channel for providing a desired choking effect drilled therein. The reduction may be formed e.g. by narrowing the channel locally so that a desired choking effect is achieved. The groove 20 connects the feeds of flows received by all adjustment elements 22 of the arrangement, i.e. all channels 18 of the arrangement are in flow connection with the fitting 19 so that the barrier gas flowing from this fitting is allowed to flow to all channels 18 of the arrangement. The adjustment elements 22, e.g. choke screws, are preferably equal in size, whereby the barrier flow is divided equally between all the channels 18 of the arrangement. If barrier flows of different size are needed for different reaction gases, the sizes of the choke screws may naturally be selected differently so that a desired end result is achieved.

The reaction gas flow reversed downwards by means of the second flow-reversing element 9 is conveyed back to the first flow-reversing element 8 where the flow meets a groove 24 via which the flow is turned to a collecting channel 7 which is situated in the middle of the middle element 3 and along which the gas travels further to the above-situated feed opening of the reaction chamber 2. All feed lines of the reaction gases are provided with corresponding drillings and grooves and they are placed preferably symmetrically around the collecting channel. The structure of the collecting channel is such that upon arrival therein, gases coming from different gas fittings 12 mix well together. This can be influenced by the shaping of the bottom of the channel as well as by the angle at which the gas is brought to the collecting channel.

Connection to the reaction chamber is carried out by means of a plane surface, ball or a corresponding structure. The back suctions may also be coupled directly to the pump line either by using the structures of the arrangement, e.g. by means of the grooves provided in the arrangement and the flow fittings formed by the members covering the same, or directly by means of pipes. In the solution according to the figures, the back suction channels 5 are collected together in the discharge fitting 23 by means of a groove 25 in the second flow-reversing element 9 by using a principle similar to that in connection with a feed arrangement implemented by means of the cooperation of the groove 20 and the channels 18.

The reactor equipped with an arrangement according to the invention is driven such that a barrier gas, e.g. nitrogen, is continuously fed via the fitting 11 as disclosed above. The back suction via the channel 5 is continuously turned on. When the flow from the reaction gas fitting 12 is interrupted, no other flow than diffusion flow comes from that fitting, a barrier produced by means of the barrier gas flow works and such a reaction gas tail is conveyed to the back suction. When the reaction gas pulse is led either assisted by a carrier gas or without carrier gas through the arrangement, some of it is sacrificed to the back suction, but a vast majority thereof, substantially about 90%, continues its travel directly to the reaction chamber. Nitrogen acting as the barrier gas is also mixed with this gas flow. When the reaction gas flow and the feed of the possible flow-enhancing carrier gas is terminated, the arrangement returns automatically to a state closing the reaction gas flow.

When it is desired to enhance the operation and decrease back suction losses, the feed of the barrier gas, e.g. nitrogen, may be synchronized with the pulsing of the reaction gas feed as follows. During a pulse, a barrier nitrogen is fed to the fitting 5 in an amount of at least that of the barrier flow, whereby no reaction agent goes to waste. Similarly, the nitrogen barrier flow may be reduced to a level to prevent the reaction agent flow from entering the nitrogen feed channel.

The above-disclosed additional property is thus completely possible but a simple implementation where a continuous barrier agent flow is used gives an extremely advantageous end result.

The arrangement according to the invention enables the feed of the reaction gases and the barrier gas to be implemented by a few entities which may be disassembled in a simple manner for cleaning and checking. The structure is small and symmetrical. All gases are treated alike and, when necessary, the solution may utilize separate contaminating sacrifice pipes that can be replaced when necessary. Usually, the point that gets clogged is the one at which the back suctions meet.

In the structure according to the invention, the back suctions may be conveyed in an advantageous manner separately to a post reaction chamber space, which may be called e.g. a suction box 26, whereby the need for maintenance is reduced. The structure is also easy to seal with respect to the intermediate space by different sealing manners by one sealing 27. Such a sealing may be carried out e.g. by elastomers, such as o-rings or by providing a sealing groove on the boundary surface of each flange pair, the groove being connected by drillings either to the back suction or correspondingly to the nitrogen feed. In the first case, the sealing groove has an underpressure, whereby the possibly leaking gases are suctioned to be discharged irrespective of whether they originated from the pipes inside the structure or from outside the structure. Correspondingly, in the second case, from the sealing groove the gases leak both outwards and inwards.

The arrangement according to the invention may in an advantageous manner be integrated in other lead-throughs of the reactor's underpressure chamber and/or the underpressurized reaction chamber, which gives an advantageous solution as far as the overall situation is concerned. Examples of the aforementioned facts include e.g. minimization of structural problems caused by lead-throughs, etc.

The heat management of the arrangement according to the invention is particularly advantageous. The arrangement may also operate as part of the accompanying heating going through a cold chamber. In addition to a metal material, the arrangement according to the invention is also advantageous to manufacture from more exotic materials, even glass or ceramic materials.

The above-disclosed exemplary embodiment of the invention is by no means intended to restrict the invention, but it may be completely freely modified within the scope of the claims. Thus, the dimensions, number of fittings, placement, driving manner of the apparatus, etc. of the arrangement according to the invention may be varied absolutely freely as necessary.

The invention claimed is:

1. An arrangement in connection with an ALD reactor comprising a reaction chamber, the arrangement comprising fittings for feeding a reaction gas to the reaction chamber and for suctioning the reaction gas back, and fittings for feeding a barrier gas, wherein the fittings for feeding and suctioning back the reaction gas and for feeding the barrier gas comprise a middle element having multiple parallel channels which extend through the element, and a first and a second flow-reversing element arranged at ends of the middle element into which the channels open, the flow-reversing elements being arranged to combine the channels in the middle element so as to provide an interchannel flow.

2. An arrangement as claimed in claim 1, wherein surfaces of the flow-reversing elements facing the middle element are provided with grooves which together with the surface of the middle element form flow paths connecting the channels.

3. An arrangement as claimed in claim 2, wherein both flow-reversing element is provided with a fitting for feeding a barrier gas.

4. An arrangement as claimed in claim 1, wherein both flow-reversing element is provided with a fitting for feeding a barrier gas.

5. An arrangement as claimed in claim 4, wherein a surface of the second flow-reversing element facing away from the middle element is provided with grooves which together with a cover element to be placed on top of the second flow-reversing element form a flow path for the barrier gas.

6. An arrangement as claimed in claim 5, wherein the second flow-reversing element is provided with second drillings arranged to form barrier gas flow connections from the grooves in the surface facing away from the middle element to the grooves in the surface facing the surface of the middle element.

7. An arrangement as claimed in claim 6, wherein an adjustment element or a reduction is arranged in the second drilling so as to provide flow choking.

8. An arrangement as claimed in claim 1, wherein an adjustment element or a reduction is arranged in at least one channel extending through the middle element so as to provide flow choking.

9. An arrangement as claimed in claim 8, wherein the channels(s) is/are arranged by means of a groove formed in the second flow-reversing element to be in a flow connection to a common discharge fitting.

10. An arrangement as claimed in claim 1, wherein a collecting channel is provided in the middle of the middle element, and other channels radially and symmetrically around it, whereby as seen in a radial direction, each channel is arranged to be in a flow connection with an adjacent channel and further with the collecting channel.

11. An arrangement as claimed in claim 1, wherein the middle element is formed from a massive piece and that the channels are formed by drilling into the massive piece.

12. An arrangement as claimed in claim 1, wherein an entity formed by the middle element and the first and the second flow-reversing element is fastened by means of one flange structure to gas sources, whereby gas fittings of the flange structure and the drillings of the first flow-reversing element form a uniform flow path from the gas sources via the middle element to the reaction chamber.

13. An arrangement as claimed in claim 12, wherein a common sealing structure sealing the entire arrangement is arranged in connection with the flange structure.

14. An arrangement as claimed in claim 12, wherein the arrangement is integrated in other lead-throughs of the reactor.

15. An arrangement as claimed in claim 12, wherein the arrangement is arranged to operate as part of accompanying heating of the reactor.

* * * * *